(12) United States Patent
Belforte et al.

(10) Patent No.: US 6,194,909 B1
(45) Date of Patent: Feb. 27, 2001

(54) CONSTRUCTIVE MODULE OF AN ELECTRONIC TELECOMMUNICATIONS EQUIPMENT, WITH AN INTERFACE TOWARDS A TESTING AND DIAGNOSING SYSTEM

(75) Inventors: Piero Belforte; Flavio Maggioni, both of Turin (IT)

(73) Assignee: Cselt- Centro Studi E Laboratori Telecomunicazioni S.p.A., Turin (IT)

(*) Notice: Subject to any disclaimer, the term of this patent is extended or adjusted under 35 U.S.C. 154(b) by 0 days.

(21) Appl. No.: 09/117,725

(22) PCT Filed: Apr. 1, 1997

(86) PCT No.: PCT/EP97/01632

§ 371 Date: Aug. 5, 1998

§ 102(e) Date: Aug. 5, 1998

(87) PCT Pub. No.: WO97/37234

PCT Pub. Date: Oct. 9, 1997

(30) Foreign Application Priority Data

Apr. 2, 1996 (IT) .............................. TO96A0256

(51) Int. Cl.[7] ................................. G01R 31/02
(52) U.S. Cl. .................. 324/763; 324/73.1; 324/158.1
(58) Field of Search .............. 324/96, 763, 765, 324/754, 72.5, 73.1, 158.1; 359/170, 169; 455/67.1; 439/482, 824

(56) References Cited

U.S. PATENT DOCUMENTS

| | | | |
|---|---|---|---|
| 4,498,196 | * 2/1985 | Holoyda et al. | 455/607 |
| 4,646,299 | * 2/1987 | Schinabeck et al. | 324/73.1 |
| 4,731,879 | * 3/1988 | Sepp et al. | 455/605 |
| 4,810,956 | 3/1989 | Hvezda et al. | |
| 5,252,914 | 10/1993 | Bobbit et al. | |

FOREIGN PATENT DOCUMENTS 33 22 914    2/1984 (DE) .

OTHER PUBLICATIONS

International Test Conference 1988 Proceedings, Washington, Sep. 1988, pp. 13–22, Sheng–Jen Tsai et al: "GaAs Driver and Sensor for a High Speed Test System".

* cited by examiner

Primary Examiner—Vinh P. Nguyen
(74) Attorney, Agent, or Firm—Herbert Dubno

(57) ABSTRACT

An electronic telecommunications module has circuit components and conductors forming a telecommunications circuit having insertion points at which signals can be applied for test purposes and monitoring points from which responses can be tapped. The insertion and monitoring probes are mounted on the module and are connected to the respective points by shielded microcoaxial cables and the probes are connected by shield and microcoaxial cables on the connectors to allow interfacing between the particular module and the testing and diagnostic system.

10 Claims, 2 Drawing Sheets

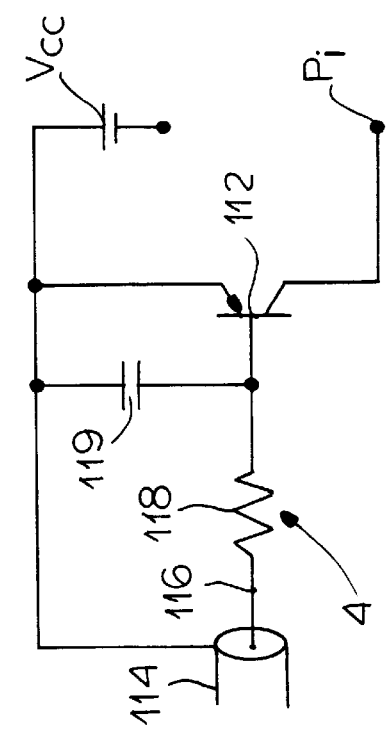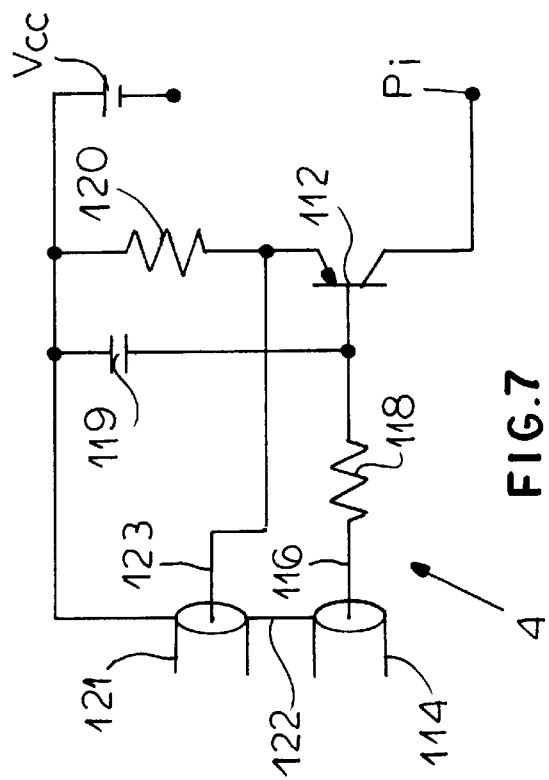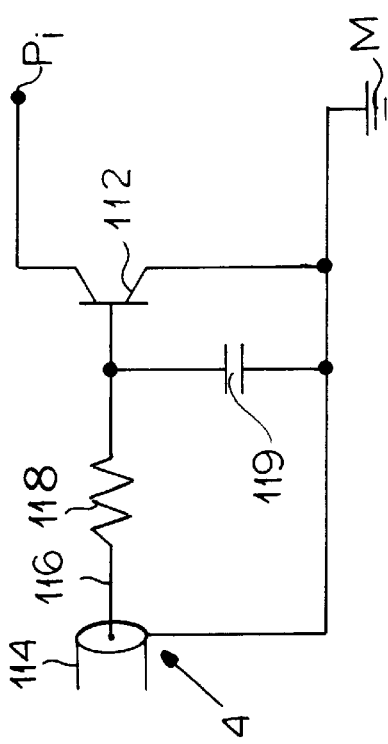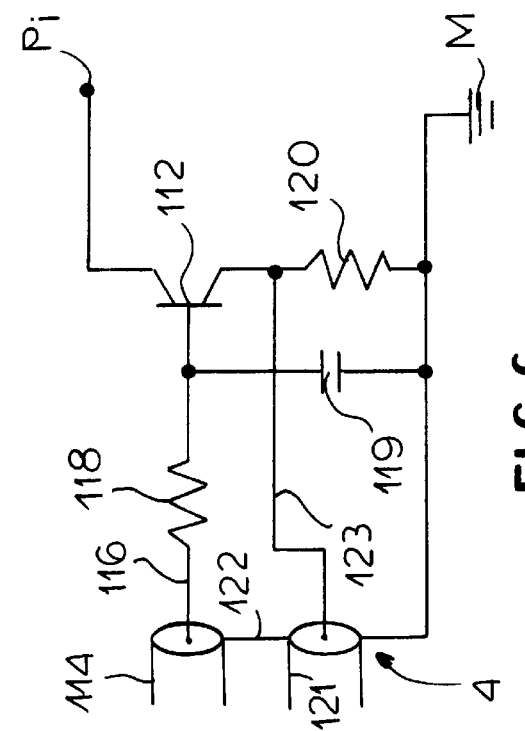

CONSTRUCTIVE MODULE OF AN ELECTRONIC TELECOMMUNICATIONS EQUIPMENT, WITH AN INTERFACE TOWARDS A TESTING AND DIAGNOSING SYSTEM

CROSS REFERENCE TO RELATED APPLICATIONS

This application is a national stage of PCT/EP97/01632 filed Apr. 1, 1997 and based in turn on Italian national application TO 96 A 000256 filed Apr. 2, 1996 under the International Convention.

FIELD OF THE INVENTION

The present invention relates to electronic telecommunications equipment and in particular, to a module for such equipment it concerns a constructive module for such an equipment, which module is The invention deals with a module which equipped with means for interfacing it with a testing and diagnosing system via pre-determined insertion or monitoring points in the module, which means can be mounted at least temporarily and in a non-invasive fashion onto the module itself. Such a constructive module is known from U.S. Pat. No. 5,252,914.

BACKGROUND OF THE INVENTION

A module is known from U.S. Pat. No. 5,252,914 which can be connected to such a system, In electronic telecommunications equipment (e.g. switching exchanges) it is often necessary to check and test the behavior of the equipment or of parts thereof, both during the testing phase and during its regular operation. One of the tests carried out on the system consists in creating fault conditions and in monitoring and analyzing the response of the equipment. The fault condition is generally obtained by forcing some points of the equipment to a pre-set signal level, e.g. corresponding to logic 0 or logic 1, depending on the manufacturing technology employed for the logic circuits mounted on the module. Other tests may require injecting current noisew.

Hereinafter, the terms "actuation" (with no other specifications) or "signal insertions" shall be used to indicate both fault actuation and noise injection.

Tests need to be automated, and this requires that the equipment parts to be tested (hereinafter referred to as "modules") may be associated, at least temporarily, with interfacing means which on the one hand are driven by a testing and diagnosing system sending the signal insertion commands in a programmed fashion, and which on the other hand transfer the responses of the modules to the testing and diagnosing system. During the tests it is necessary to obtain conditions exactly corresponding, from the electrical point of view, with those which may occur during equipment operation, the normal operation of the equipment must not be disturbed in the absence of signal insertion and, conversely, the insertion commands and the responses must not be altered by signals present in a module under test. Moreover, mounting the interface means on the module must not require modifications to the construction or design of the module.

In the above-mentioned prior art In U.S. Pat. No. 5,252,914 which concerns a transceiver on a circuit board with a series of modules, diagnosis is carried out by coupling test equipment to some pins of the permanent connectors of the circuit board and additional pressure pins placed so as to provide for connections with the input and output pins of the modules on the board. The diagnosis facilities are thus restricted to what can be tested by contacting these pins.

OBJECTS OF THE INVENTION

It is the object of the present invention to provide a module of electronic equipment for telecommunications which allows tests to be performed in such a way as to meet the aforesaid requirements, without placing particular constraints on the module design rules.

SUMMARY OF THE INVENTION

According to the invention actuation probes, driven by control signals provided by a testing and diagnosing system for the automatic and programmed insertion of test signals into the pre-determined insertion points of the module are provided. Monitoring probes to collect signals present in the module from the monitoring points and transfer such signals to the testing and diagnosing system. Shielded micro-coaxial cables, connected on the one side to the actuation and monitoring probes and on the other side to connectors provided on the module, are used for signal transfer between the connectors and the probes. Conditioning means, associated with the connectors for the cables intended to provide the control signals to the actuation probes, allow signal insertion into modules based on different technologies by using the same type of control signal provided by the testing and diagnosing system and to provide a galvanic isolation between the testing and diagnosing system and the modules under test.

BRIEF DESCRIPTION OF THE DRAWING

The above and other objects, features, and advantages will become more readily apparent from the following description, reference being made to the accompanying drawing in which:

FIGS. 4 to 7 are circuit diagrams of actuation probes.

SPECIFIC DESCRIPTION

Figure 1:
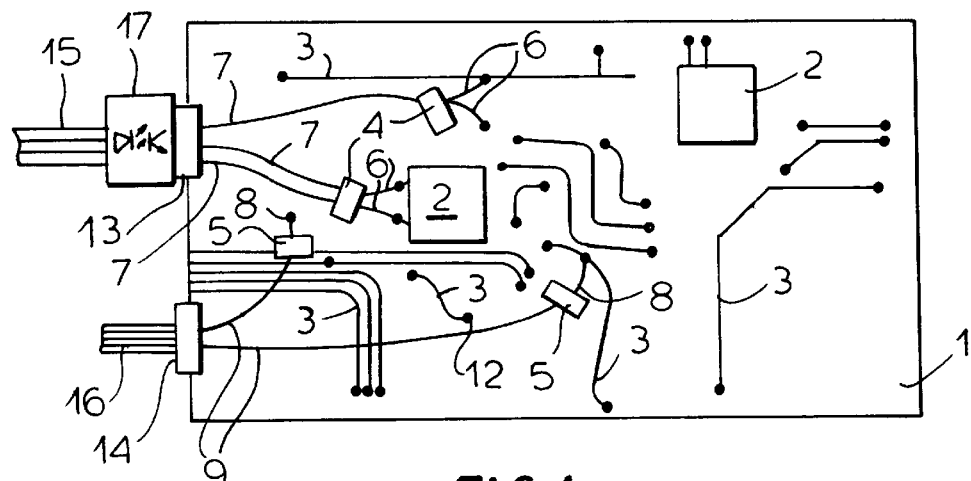
FIG. 1 is a schematic view of a constructive module fitted with actuation and monitoring probes, according to the invention.
Figure 3:
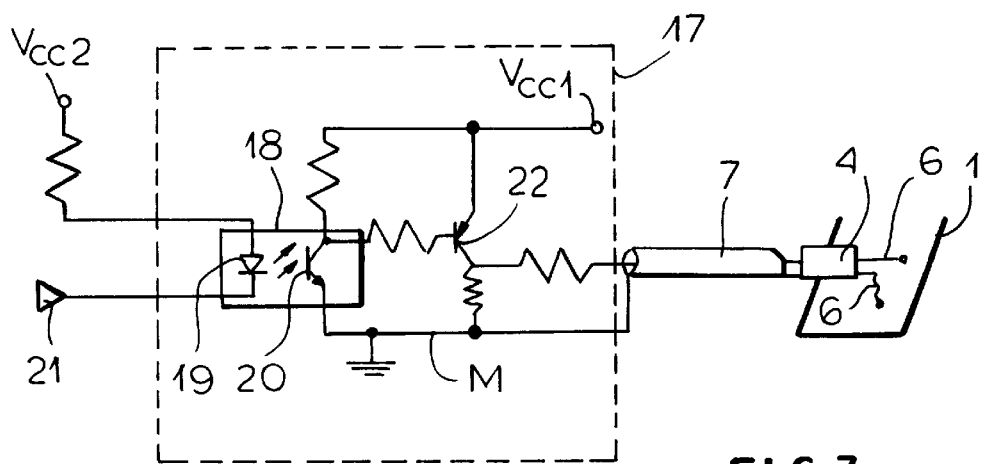
FIG. 3 is an electrical diagram of the connection of an actuation probe.

In FIG. 1, a circuit module 1 of an electronic telecommunications device (e.g. a printed circuit board) carries components 2 interconnected by means of the printed conductors on the board. The wiring pattern of the printed circuit is shown in FIG. 3.

Board 1 carries actuation (or signal insertion) probes 4 and monitoring probes 5. Actuation probes 4 may be fault actuation probes or noise injection probes, controlled by a testing and diagnosing system, not represented beyond the blocks shown as representing these probes. They are meant to connect points of the equipment to a predetermined voltage level (corresponding to logic level 0 or logic level 1, depending on the probe type) or to inject into these points a noise represented by an adjustable current. Monitoring probes 5 are meant to transfer towards the testing and diagnosing system the electrical responses of the points upon actuation of a fault or injection of a noise, or in general to monitor the normal operation of the equipment. It may be necessary to mount a few tens of probes 4, 5 on each board to be tested: the probes then need to be miniaturized units, in order to fit in spaces between the components mounted on the board and not to hamper mounting the boards thus equipped in the same housings (cabinets and drawers) meant to receive conventional boards without probes. In this way, no construction modifications are necessary either to the boards or to the housings. In particular, it is not necessary to make use of extension cards.

Signal insertion probes, in the case of fault actuation, may be for example the probes described in our previous Italian patent application No. TO96A000168 filed on Mar. 6 1996, (U.S. application Ser. No. 09/117,969 filed Aug. 7, 1998) which discloses also the manufacture of said probes as miniaturized components, e.g. components made by the techniques known with the acronym SMD (Surface Mounting Device). Exemplary embodiments of said probes will be disclosed hereinafter.

In case of noise injection, actuation probes can be simple current generators (a transistor with a resistor in series with the emitter), and therefore they can easily be miniaturized, e.g. by using the same technology as that used for manufacturing the fault actuation probes. The same holds true for monitoring probes, which can be made of simple resistors.

Hereafter, to keep the description simpler, reference shall be made to fault actuation through the use of the probes according to the aforementioned patent application. The considerations which follow can also be applied to noise injection.

A pair of conductors 6 come out from one side of the body of probes 4 for connection to the fault actuation points and to the predetermined voltage, through the access points available on the standard board 1. A shielded micro-coaxial cable 7, through which the command provided by the testing and diagnosing system is carried to the probe, comes out from the other side of the probe. Obviously, if actuation probes 4 send towards the testing and diagnosing system a signal indicating current absorption at the insertion point (as described in the aforementioned patent application), each probe will be associated with a pair of shielded cables 7. Similarly, a conductor 8 for connection with the point on board 1 wherefrom the response is taken and a shielded micro-coaxial cable 9 to send the response to the testing and diagnosing system will come out from monitoring probes 5.

With regard to the connection between the probes and the board, depending on the manufacturing technology used for board 1, access points are either the pins of the components or the through holes on printed circuit wiring 3, or the test points, provided for in the design of the board, for performing functional tests on the board (e.g. the pads for performing so-called "nail bed tests").

Access through component pins is chiefly applicable for less advanced packaging technologies, for instance dual-in-line or pin grid array (known by the acronym PGA), characterised by a wide enough pin pitch, and it requires soldering conductors 6, 8 directly to the pins.

Figure 2:
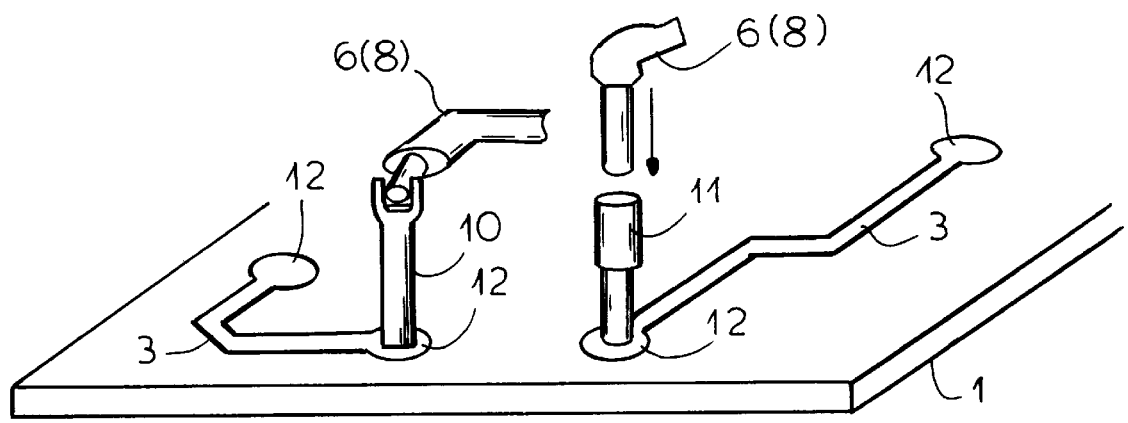
FIG. 2 is a schematic representation (perspective view) of preferred embodiments of the means for connecting a probe to the module.

For more advanced component mounting technologies, such as the already mentioned SMD technology, where component pin pitch is rather small, access through the pins may be more difficult (or even impossible) once the component is mounted onto the board and it may cause short circuits which may distort the results of the test and possibly even damage the board. Under these conditions, the connection between the probes and the module can be accomplished as shown in FIG. 2, by inserting the ends of conductors 6, 8 into metal supports (forks 10 or pits 11) inserted in turn into metallized holes 12 (e.g. the through holes normally provided for in the boards). That solution allows both a permanent connection of probes 4, 5 to board 1 (by soldering conductors 6, 8 to supports 10, 11) and a removable connection, by simply inserting the conductors in the supports.

The same kind of mounting depicted in FIG. 2 can be adopted for the aforesaid pads, which generally include holes.

Regardless of the mounting method chosen, therefore, it is possible to store a board fitted with the probes, in order to have it always available to repeat the tests, for instance when developing new versions of the equipment.

It should be remembered that, to guarantee the effectiveness of the test, it is necessary to take into account that signal propagation phenomena may cause false switching in the circuits downstream of a fault insertion point, even if the actuation probe were ideal (free of parasitic parameters). For this reason, even when it is physically possible to apply the actuation probe in correspondence of a transmitter ("driver") to be tested, it may be appropriate to cause the simulated fault at an intermediate point of the connection been the driver and a receiver. The choice of the insertion point can be performed while analyzing the board behavior, by means of software procedures of no interest for the purposes of this invention. It is evident that, if the board fitted with the probes is stored, it is not necessary to repeat the procedures for identifying the test points for subsequent tests.

Going back to FIG. 1, the use of shielded micro-coaxial cables 7, 9, for signal transfer between the probes and the testing and diagnosing system guarantees the absence of interference between the test signals and the signals present on the board during the normal operation of the equipment the board is part of. Moreover, the cables also provide for a better control over wave form quality, thanks to controlled impedance, and they allow a fairly wide band of the signal collected by the monitoring probes to be maintained. Lastly, the cross sectional size of these cables does not cause any size problems, and therefore does not hamper mounting the boards in their respective housings, even when each board is equipped with several probes.

At the opposite end to the one connected to probes 4, 5, coaxial cables 7, 9 terminate respectively in connectors 13, 14 (of a conventional type), which are connected to lines 15, 16 for connection to the reminder of the testing system. Connectors 13 for the cables of probes 4 are associated with conditioning devices 17 whose purpose is dual:

to allow use of the same type of fault actuation commands for modules based on different technologies (TTL, CMOS, ECL) which may require forcing the insertion point to logic level 0 or logic level 1 and, for a given logic level, to a different voltage level;

to provide a galvanic isolation between the testing and diagnosing system and the boards under test, to avoid spurious connections between grounds in different boards or racks through the probes.

With this arrangement, the electrical diagram of connection of an actuation probe 4 is as depicted in FIG. 3, where the elements described in the previous Figures are indicated by the same characters. $V_{CC1}$, M, $V_{CC2}$ indicate the power supply voltage and the ground of board 1, and respectively the power supply voltage used by the testing and diagnosing system. Conditioning means 17 comprises an opto-isolator 18 whose photodiode is energized by the control signal generated by circuit 21 driving probe 4, whereas phototransistor 20 (e. g. an n-p-n transistor) sends the control signal onto cable 7 through a circuit comprising a p-n-p transistor 22 which is to amplify and invert the signals. Thus, the probe is actuated when the photodiode emits light, and not vice versa, as would be the case in the absence of transistor 22. This is required to prevent transient noise on all probes every time the fault insertion command is activated or de-activated.

For sake of completeness of the description, hereinafter the structure and the operation of probes 4 are summarized.

The basic component of probe 4 is a transistor 112, which preferably is an n-p-n bipolar transistor in the solutions shown in FIGS. 4 and 6 and is a p-n-p bipolar transistor in the solutions shown in FIGS. 5 and 7. The collector of transistor 112 corresponds to the terminal of probe 4 meant to be permanently or temporarily connected to the fault insertion point Pi. The emitter of transistor 112, on the other hand, corresponds to the terminal of the probe meant to be connected, here too permanently or temporarily, to the pre-determined signal level, which is assumed to be ground level M in FIGS. 4 and 6, and power supply $V_{cc}$ in FIGS. 5 and 7. In general terms, the embodiments using an n-p-n transistor (FIGS. 4 and 6) allow forcing point Pi to the lower one of the reference voltage levels corresponding to the two logic levels, i.e. M (typically 0 Volts) or $-V_{cc}$ (e.g. –5V) and the embodiments using a p-n-p transistor (FIGS. 5 and 7) allow instead forcing point Pi to the higher reference voltage level, i.e. $+V_{cc}$ or M, respectively.

In the diagrams of FIGS. 4 and 5, probe 4 is connected to the testing and diagnosing system by means of a coaxial cable (corresponding to one of cables 7 in FIG. 1) of which shield 114 is connected to the reference voltage (ground M or power supply voltage $\pm V_{cc}$), and hence to the emitter of transistor 112, and internal conductor 116 is connected to the base of transistor 112 through a bias resistor 118 whose resistance is, for example, of the order of 40 Ohm. A suitable command signal supplied through cable 114, 116 and resistor 118 brings transistor 12 to saturation when fault actuation is desired.

In the embodiments shown in FIGS. 6 and 7 a resistor 120 whose resistance is, for example, of the order of one Ohm, is connected in series with the emitter of transistor 112. Thus the current flowing in transistor 112 (between collector and emitter) when transistor 112 is in saturation condition, i.e. when fault insertion is being performed, passes through resistor 120. The voltage across resistor 120 is a signal representative of the value of that current, which signal is sent back to the testing and diagnosing system through a coaxial cable (corresponding to the second one of cables 7 in FIG. 1) with a shield 121 which usually is connected electrically in 122 to shield 114 of the cable driving the base of transistor 112, and an internal conductor 123 connected to the emitter of transistor 112. As a consequence, cable 121, 123 carries a signal which is representative of current absorption in correspondence with fault insertion point Pi, thus allowing indications to be obtained on the electrical load induced on equipment A by the fault insertion.

Probe 4 further comprises a capacitor 119 which is directly connected between the base and the emitter of transistor 112 to eliminate the effects of the parasitic capacitance ($C_{CB}$) existing between the collector and the base, which capacitance makes the presence of probe 4 connected to point Pi affect the signals passing in point Pi, particularly when fault insertion is not being performed. Actually, referring by way of example to FIG. 4, under these conditions, in correspondence with the rising edge of the signal present on point Pi the parasitic capacitance tends to create an electrical coupling between collector and base such as to bring, at least for a short instant, the base of transistor 112 to a level sufficient to make the base-emitter junction conduct. Consequently, there is a current flow through the collector and the emitter of transistor 112 itself. This results, in practice, into a rather "distorted" rising edge, that is voltage on point Pi does not grow steeply (step voltage) but rather with a more or less rounded edge influenced by the conduction phase induced into transistor 112. The same considerations apply identical to the embodiment of FIG. 6, and to the falling edges of the signals in the embodiments of FIGS. 5 and 7.

To eliminate the above drawbacks, capacitor 119 must have a capacitance value substantially higher, preferably by about two orders of magnitude, than said parasitic capacitance (which generally is of the order of 1 pF): for instance a capacitance of 40 pF is suitable for capacitor 119. Capacitor 119 can effectively contrast (and, for practical purposes, cancel out) the tracking of the collector of transistor 112 by the transistor base due to the parasitic capacitive coupling.

The structure just described meets the requirements described above. As was clearly explained in the aforementioned patent application, the electrical structure of the actuation probes is such that they practically do not disturb the operation of the equipment under test in the absence of a simulated fault or injected noise. The use of shielded coaxial cables prevents mutual influence between test signals and signals present on the module during normal operation. Connecting the probes to access points provided in the manufacturing stage and using miniaturised probes eliminate the need for design and construction modifications either for the modules themselves or for the structures destined to house them. Lastly, conditioning means using opto-isolators prevent spurious connections between the grounds of different modules through the testing and diagnosing system.

It is evident that what has been described is provided purely by way of non-limiting example and that variations and modifications are possible without departing from the scope of the invention.

What is claimed is:

1. An electronic telecommunication module comprising:
   circuit components interconnected in an electronic circuit for use in telecommunications by conductors on said module; said components and said conductors interconnecting said components having signal insertion points and monitoring points for testing and analyzing; and
   means for interfacing said circuit with a testing and diagnosing system, said means for interfacing including:
   a plurality of actuation probes driven by control signals provided by said testing and diagnosing system, for the automatic and programmed insertion of test signals into predetermined insertion points;
   a plurality of monitoring probes to collect signals present in the module from the monitoring points and transfer such signals to the testing and diagnosing system;
   shielded micro-coaxial cables connected on one side to said actuation and monitoring probes and on another side to connectors provided on the module, for signal transfer between the connectors and the probes; and
   conditioning means associated with the connectors and the cables for providing the control signals to the actuation probes, to allow signal insertion into modules based on different technologies by using the same type of control signal provided by the testing and diagnosing system and to provide a galvanic isolation between the testing and diagnosing system and the modules.

2. The electronic telecommunication module defined in claim 1 wherein said actuation probes comprise probes for connecting pre-determined points of the module to a pre-determined voltage level to simulate in these points a possible fault condition, and probes for injecting an adjustable current, simulating an interference, into these points, and said monitoring probes are arranged to collect responses from monitoring points connected with the insertion points and to transfer these responses to the testing and diagnosing system.

3. The electronic telecommunication module defined in claim 1 wherein said probes are made as miniaturized components.

4. The electronic telecommunication module defined in claim 1 wherein the insertion and/or monitoring points comprise pins of the components mounted on the module and said probes are permanently fixed to these points.

5. The electronic telecommunication module defined in claim 4 wherein the insertion points are placed in correspondence with a component in which the fault is to be simulated or a noise is to be injected.

6. The electronic telecommunication module defined in claim 1 wherein the insertion and/or monitoring points comprise pads for contact with the probes for performing functional tests on the module.

7. The electronic telecommunication module defined in claim 6 wherein the insertion points are intermediate points of a connection between a first component in which the fault is to be simulated or a noise is to be inserted and a second component which receives signals coming from the first component.

8. The electronic telecommunication module defined in claim 6 wherein the probes have conductors for connection with the respective insertion or monitoring point, an end of each of said conductors of the respective probe being anchored in a metal supports inserted into the respective pad.

9. The electronic telecommunication module defined in claim 1 wherein the insertion and/or monitoring points comprise metallized through holes pierced along said conductors.

10. The electronic telecommunication module defined in claim 1 wherein said conditioning means comprise an opto-isolator including a phototransistor and means for amplifying and inverting the signal emitted by the phototransistor of the opto-isolator.

* * * * *